United States Patent [19]

Ushirogouchi et al.

[11] Patent Number: 5,169,740
[45] Date of Patent: Dec. 8, 1992

[54] POSITIVE TYPE AND NEGATIVE TYPE IONIZATION IRRADIATION SENSITIVE AND/OR DEEP U.V. SENSITIVE RESISTS COMPRISING A HALOGENATED RESIN BINDER

[75] Inventors: Toru Ushirogouchi, Yokohama; Tsukasa Tada, Hachioji; Akitoshi Kumagae, Yachiyo, all of Japan

[73] Assignee: Kabushiki Kaisha Toshiba, Kawasaki, Japan

[21] Appl. No.: 500,923

[22] Filed: Mar. 29, 1990

[30] Foreign Application Priority Data

Mar. 29, 1989 [JP]  Japan .................. 1-77037

[51] Int. Cl.$^5$ ............. G03F 7/022; G03F 7/023; G03F 7/012; G03F 7/32
[52] U.S. Cl. ................... 430/192; 430/165; 430/167; 430/193; 430/197; 430/270; 430/325; 430/326; 430/330; 430/907; 430/942; 430/945; 430/966
[58] Field of Search ............ 430/192, 193, 197, 325, 430/330, 165, 167, 326, 942, 907, 966, 945

[56] References Cited

U.S. PATENT DOCUMENTS

| | | | |
|---|---|---|---|
| 4,500,629 | 2/1985 | Irving et al. | 430/195 |
| 4,572,890 | 2/1986 | Goodin et al. | 430/325 |
| 4,642,282 | 2/1987 | Stahlhofen | 430/192 |
| 4,842,983 | 6/1989 | Hasegawa | 430/192 |
| 4,859,563 | 10/1989 | Miura et al. | 430/326 |
| 5,023,311 | 6/1991 | Kubota | 430/192 |

FOREIGN PATENT DOCUMENTS

| | | |
|---|---|---|
| 164248 | 12/1985 | European Pat. Off. . |
| 224911 | 6/1987 | European Pat. Off. . |
| 2512933 | 10/1975 | Fed. Rep. of Germany . |
| 58-42041 | 3/1984 | Japan . |
| 61-193145 | 8/1986 | Japan . |
| 62-164045 | 7/1987 | Japan . |
| 2079481 | 1/1982 | United Kingdom . |

Primary Examiner—Charles L. Bowers, Jr.
Assistant Examiner—John S. Y. Chu
Attorney, Agent, or Firm—Oblon, Spivak, McClelland, Maier & Neustadt

[57] ABSTRACT

Resist containing novolak prepared by condensating halogenated phenol represented by the following formula (III) and one or more phenol derivatives selected from the group consisting of cresol, xylenol, tet-butylphenol and propenylphenol, with a carbonyl compound

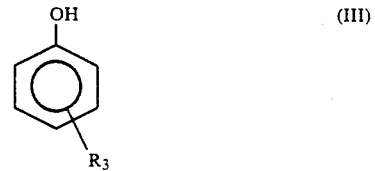

(III)

wherein $R_3$ is an halogen atom selected from the group consisting of F, Cl, and Br. If the resist is used as a positive-type one, it further contains a photo-sensitive agent, and $R_3$ in the formula (III) is either F or Br. If the resist is used as a negative-type one, it further contains a photosensitive agent and/or a sensitizer, and $R_3$ in the formula (III) is either Cl or Br.

2 Claims, No Drawings

POSITIVE TYPE AND NEGATIVE TYPE IONIZATION IRRADIATION SENSITIVE AND/OR DEEP U.V. SENSITIVE RESISTS COMPRISING A HALOGENATED RESIN BINDER

BACKGROUND OF THE INVENTION

1. Field of the Invention

The present invention relates to resist useful for forming a fine resist pattern.

2. Description of the Related Art

Resist is widely used in the planar processes to manufacture semiconductor devices such as LSIs. In recent years, electronic devices capable of performing more functions with higher efficiency have been developed, incorporating ICs which have very high integration densities. To manufacture such high integration density ICs, resist patterns which have not only sufficient fineness and but also enough heat-resistance for being able to endure reactive ion etching (RIE) must be used. Hence, there is a demand for a resist which has high resolution and heat resistance.

Published Unexamined Japanese Patent Applications 62-25349 and 61-164740 disclose a resist which has sufficient heat resistance and resolution. The higher the p-cresol content of the resist, the higher the resolution. However, if the resist contains an excessive amount of p-cresol, its alkali-solubility and its molecular weight will decrease. In this case, the resist has neither sufficient photosensitivity nor sufficient heat-resistance. Therefore, a composition or an efficiency of the resist is limited. In addition, when these resists are exposed to ionizing radiations, a crosslinking reaction occurs, and sensitivity of the resists used as positive-type resists is lowered.

The conventional negative-type resist has but a relatively low heat resistance. Nor does it have sufficient transparency; it in fact absorbs a considerable amount of light. Hence, especially when exposure is performed by using light having short wavelengths, light applied to a layer of this conventional resist, formed on a semiconductor substrate, cannot reach the surface of the layer which is in contact with the substrate. As a consequence, only a low-profile resist pattern can be obtained.

SUMMARY OF THE INVENTION

A first object of the present invention is to provide a positive-type resist which has high photo-sensitivity, high resolution, and high heat resistance.

A second object of the present invention is to provide a positive-type resist which has high sensitivity to ionizing radiations as well as the properties of above mentioned positive-type resist.

A third object of the invention is to provide a negative-type resist which has high photosensitivity, high resolution, and high transparency.

According to this invention, there is provided a resist which contains novolak prepared by condensating halogenated phenol represented by the following formula (III) and one or more phenol derivatives selected from the group consisting of cresol, xylenol, tert-butylphenol, and propenylphenol, with a carbonyl compound,

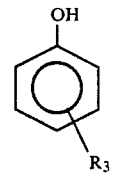

wherein $R_3$ is an halogen atom selected from the group consisting of F, Cl, and Br.

The resist according to the invention, if used as a positive-type resist, further contains a photosensitive agent, and it is preferred that $R_3$ in the formula (III) is either F or Br.

The resist according to the invention, if used as a negative-type resist, further contains a photosensitive agent and/or a sensitizer, and it is preferred that $R_3$ in the formula (III) is either Cl or Br.

DETAILED DESCRIPTION OF THE PREFERRED EMBODIMENTS

Among halogenated phenols represented by the general formula (III) are: o-chlorophenol, m-chlorophenol, p-chlorophenol, o-bromphenol, m-bromphenol, p-bromphenol, o-fluorophenol, m-fluorophenol, and p-fluorophenol.

The cresol mentioned above may consist of one or more cresols selected from the group consisting of o-cresol, m-cresol, and p-cresol.

The xylenol mentioned above can be selected from a great variety of xylenols. However, 2,5-xylenol and 3,5-xylenol are most useful.

The tert-butylphenol mentioned above may consist of one or more tert-butylphenols selected from the group consisting of o-tert-butylphenol, m-tert-butylphenol, and p-tert-butylphenol.

The propenylphenol mentioned above may consist of one or more propenylphenols selected from the group consisting of o-propenylphenol, m-propenylphenol, and p-propenylphenol.

The carbonyl compound mentioned above can be formaldehyde, acetaldehyde, benzaldehyde, phenylacetaldehyde. Alternatively, acetone can be used as this compound since it functions as a condensation agent if phosphorus oxycholoride is added to it.

The novolak mentioned above can be obtained by first mixing any halogenated phenol of the formula (III) and the selected phenol derivative or derivatives in any mixing ratio, and then condensating the resultant mixture with the carbonyl compound. However, as will be apparent from the following description, it is better of select a halogenated phenol in accordance with the type of resist (positive-type or negative-type), and to mix the halogenated phenol thus selected with the selected phenol derivatives in a specific mixing ratio determined also by the type of resist.

The resists according to the invention can be classified into the following three types:
1. Positive-type resist to be exposed to ultraviolet rays having long wavelengths of 300 nm or more
2. Positive-type resist to be exposed to ultraviolet rays having short wavelengths or ionizing radiation
3. Negative-type resist. In particular, negative-type resist to be exposed to ultraviolet rays having short wavelength or ionizing radiation.

These three types of resists will be described, one by one.

RESIST OF THE FIRST TYPE

The halogenated phenol used in this resist as one of the components of copolymerization is one represented by the formula (III) where $R_3$ is either F or Br. The mol ratio of the halogenated phenol in the novolak (or in the total phenol) preferably ranges from 0.1 to 0.7 when the halogenated phenol is a p-substituted or an o-substituted phenol, and preferably ranges from 0.1 to 0.9 when the halogenated phenol is an m-substituted phenol. This is because, when the ratio falls outside these ranges, the resultant positive-type resist begins to lose its high photosensitivity and high heat resistance.

Also, it is desirable that the novolak have a polystyrene-equivalent molecular weight of 2,000 to 20,000. More specifically, the resin should preferably have a molecular weight of 3,000 to 20,000 when cresol is the phenol derivative polymerized with halogenated phenol, and a molecular weight of 3,000 to 10,000 when the novolak contains xylenol or tert-butylphenol in a mol ratio of at least 0.1. This is because, when the molecular weight of the novolak falls outside these ranges, the resultant positive-type resist begins to lose its high photosensitivity and high heat-resistance.

RESIST OF THE SECOND TYPE

The halogenated phenol used in this resist as one of the components of the copolymer is one represented by the formula (III) where $R_3$ is either F or Br. The mol ratio of the halogenated phenol in the novolak (or in the total phenol) preferably ranges from 0.1 to 0.5 when the halogenated phenol is a p-substituted phenol, and preferably ranges 0.1 to 0.9 when the halogenated phenol is an m-substituted phenol. This is because, when the mol ratio falls outside these ranges, the resultant positive-type resist begins to lose its high photo-sensitivity and high heat resistance. Basically, the resist can have sufficient heat resistance if it contains the halogenated phenol in a mol ratio of 0.1 or more.

Also, it is desirable that the novolak have a polystyrene-equivalent molecular weight of 2,000 to 7,000. This is because, when the molecular weight of the novolak falls outside this range, the photo-sensitivity and heat-resistance of the resultant positive-type resist are far from satisfactory. In particular, the greater the molecular weight of the novolak, the more readily the molecules are crosslinked, whereby the resist inevitably becomes less efficient.

If this positive-type resin is to be exposed to ionizing radiation, it is desirable that isopropenyl-phenol be used as the phenol derivative polymerized with the halogenated phenol. This is because the resin made by copolymerization of halogenated phenol and isopropenylphenol can decompose easily when exposed to ionizing radiation. The isopropenylphenol should preferably be either p-isopropenylphenol or o-isopropenylphenol. It should not be m-isopropenylphenol, as this will reduce the photo-sensitivity of the resultant resist. Further, the mol ratio of p-isopropenylphenol or o-isopropenylphenol in the novolak (or, in the total phenol) should preferably be 0.2 or less. If the mol ratio exceeds 0.2, the isopropenyl group undergoes cleavage and polymerization when irradiated with ionizing radiation, excessively increasing the molecular weight of the resin, and hence, causing gel formation of the resin.

RESIST OF THE THIRD TYPE

The halogenated phenol used in this negative-type resist as one of the components of copolymer is one represented by the formula (III) where $R_3$ is either Cl or Br. The mol ratio of the halogenated phenol i the novolak (or, in the total phenol) preferably ranges from 0.1 to 0.7 when the halogenated phenol is a p-substituted phenol, and preferably ranges 0.1 to 0.9 when the halogenated phenol is an m-substituted phenol. This is because, when the mol ratio falls outside these ranges, the resultant negative-type resist begins to lose its high photosensitivity and high heat resistance. Basically, the resist can have sufficient heat resistance if it contains the halogenated phenol in a mol ratio of 0.1 or more.

The second component of the copolymer, i.e., the phenol derivative, should preferably be cresol or xylenol. However, tert-butylphenol can be used. It is desirable that the novolak have a polystyrene-equivalent molecular weight of 5,000 to 20,000 when cresol only is used as the phenol derivative, and a polystyrene-equivalent molecular weight of 3,000 to 10,000 when xylenol or tert-butylphenol is used along with cresol. This is because, when the molecular weight of the novolak falls outside this range, the resultant positive-type resist can hardly acquire high photo-sensitivity or high heat-resistance.

Also, the second component of copolymer, i.e., the phenol derivative, can be allyl phenol. When allyl phenol is used, the resultant negative-type resist can have high photosensitivity. The mol ratio of allyl phenol in the novolak (or in the total phenol) should preferably be 0.2 or less. If the mol ratio exceeds 0.2, the allyl group undergoes cleavage and polymerization during synthesis of the copolymer, excessively increasing the molecular weight of the resin, and hence, causing gel formation of the resin.

The positive-type resist according to the present invention contains a photosensitive agent, besides the novolak. The negative-type resist according to the invention can contain a photosensitive agent and/or a sensitizer.

The photosensitive agent contains either a diazo compound or an azide compound. By virtue of the presence of this photosensitive agent, the positive-type or negative-type resist of this invention has high photosensitivity. Among substances which can be used as this photosensitive agent are: p-quinonediazides such as $\beta$-naphthyl amide of p-benzoquinonediazide sulfonic acid; p-iminoquinonediazides disclosed in British Patents 723,382 and 942,402; condensed products disclosed in British Patent 1,110,017 and French Patent 2,022,413, which are made by condensating diazonium salt with formaldehyde and which can dissolve in organic solvents; aromatic diazonium salts such as co-condensates made by condensating p-diazodiphenyl amine salt and 4,4-bismethoxymethyldiphenyl ether with formaldehyde; copolymerized products made by copolymerizing other aromatic products with formaldehyde; and aromatic azides such as the azide compounds disclosed in British Patent 745,886.

Of the photosensitive agents specified above, o-quinonediazides, such as aromatic ester or amide of o-naphthoquinonediazide sulfonic acid or o-naphthoquinonediazide carboxylic acid are suitable positive-type photosensitive agents. Of these agents, naphthoquinonediazide sulfonate esters of polyhydroxy-benzophenone are preferable. The most preferable are 1,2- naphthoquinonediazide sulfonate esters of 2,3,4-trihydroxybenzophenonen, or 1,2-naphthoquinonediazide sulfonate esters of 2,3,4,4'-tetrahydroxybenzophenone.

The latter of the two most preferable groups of photosensitive agent, i.e., 1,2-naphthoquinonediazide sulfonate ester of 2,3,4,4'-tetrahydroxybenzophenone, are desirable since they serve to enhance the heat resistance of the resultant resist. It is desirabled that 40 to 100% of hydroxyl groups in the 2,3,4,4'-tetrahydroxybenzophenone be estrified with 1,2-naphthoquinonediazide sulfonic acid. For example, on average, 1.6 to 4 naphthoquinonediazide groups are introduced into each molecule of 2,3,4,4'-tetrahydroxybenzophenone. Generally, 1,2-naphthoquinonediazide sulfonate ester of 2,3,4,4'-tetrahydroxybenzophenone is a mixture of 2,3,4,4'-tetrahydroxybenzophenones which has 1, 2, 3 or 4 naphthoquinonediazide groups.

Of the photosensitive agents described above, an azide compound is useful as a negative-type photo-sensitive agent. Bisazide and azide compound represented by the general formula (IV) shown in Table 1 is preferable. Actual examples of such azide compounds are those represented by the formulas (1) to (12) shown in Table 2. Also, actual examples of azide compounds other than those of the general formula (IV), which can be used as photosensitive agents, are those represented by the formulas (13) to (16) shown also in Table 2.

The amount of the photosensitive agent, which is added to the novolak, depends on the composition of the resin, and should range, preferably, from 5 to 30 parts by weight based on the solid component of the novolak. This is because, when the amount of the agent falls outside this range, the resultant resist fails to have high resolution, high heat resistance, sufficient adhesion to a substrate, or high photosensitivity.

If the resist according to the present invention is to be used as a negative-type one, it is desirable that part or all of the photosensitive agent be substituted by aminoplast resin in order to render the resist more transparent to ultraviolet rays having short wavelengths. When the resist containing amminoplast resin is baked after exposure, portions exposed to the ultraviolet rays are crosslinked with high sensitivity. Actual examples of aminoplast resin are: melamine-formaldehyde resin, urea-formaldehyde resin, glycoluril-formaldehyde resin, and benzoguanamine-formaldehyde resin, and a mixture of two or more of these resins. Cymel series and Beetle series, both manufactured by American Cynamide, Inc., are commercially available aminoplast resins, to mention a few.

The resist according to the present invention may, if necessary, contain an ultraviolet absorbent, a storage stabilizer, an antihalation agent, an adhesion improver, a surfactant, and a polymer. The adhesion improver is used to increase a bonding between a resist layer and a substrate. The surfactant may be used for forming a resist layer having a smooth surface. The polymer is used to modify layers of the resist; it can be epoxy resin, polymethyl methacrylate resin, polymethyl acrylate resin, propylene oxide-ethylene oxide copolymer, polystyrene, or the like.

The resist according to the invention can be prepared by dissolving the novolak, the photosensitive agent, and the other components in a solvent, and then filtering the resultant solution. The solvent is preferably cellosolve acetate based solvent such as ethyl cellosolve acetate or butyl cellosolve acetate, or a mixture of two or more of solvents selected from the group consisting of ethyl cellosolve acetate, butyl cellosolve acetate, ethyl cellosolve, methyl cellosolve and ethyl lactate. Each of these solvents may contain a proper amount of xylene, toluene, butyl acetate, Y-butyl lactone, dimethylformamide, or aliphatic alcohol such as isopropyl alcohol. Further, a small amount of surfactant may be added to these solvents.

The positive-type resist according to the present invention readily dissolves in alkaline solution and has high heat resistance, since the halogenated phenol is polymerized with the phenol derivative. By using conventional resins including novolak which contains a large amount of phenol derivatives such as p-substituted cresol, improved resolution is obtained. However, these resins have low solubility to the alkaline solution Further, heat resistance of these resins is lowered, because it is difficult to polymerize novolak itself. On the contrary, even if the phenol derivative contains much p-substituted cresol, high heat resistance and high alkali-solubility of the resist imparted by the halogen introduced as $R_3$ in the formula (III) is maintained, and also the resin becomes greatly sensitive to light. In addition, when light using for irradiation is ionizing radiation, ionization dose not easily occur, thus preventing the sensitivity from decrease owing to a crosslinking reaction.

As has been described, the negative-type resist according to the invention contains Cl atoms or Br atoms (substituent $R_3$). By virtue of the presence of the halogen atoms, the resin molecules are crosslinked when exposed to ultraviolet rays having short wavelengths. The resin is sufficiently sensitive to light by itself, and requires but a small amount of a negative-type photosensitive agent. Therefore, the resist has high transparency and can be made into a resist pattern having an excellent profile. Further, by adding aminoplastic resin into the resist, crosslinking reaction occurs with high efficiency when the resist is exposed to ultraviolet rays. In short, the negative-type resist has high photosensitivity.

When either the positive-type or negative-type resist according to the present invention is coated on a substrate to form a resist layer which is exposed to light through a patterned mask and treated with an alkaline developing agent, a fine resist pattern will be formed which has a good profile and high heat resistance. When the resist pattern, thus formed, is used as an etching mask in dry-etching the substrate, it will neither be softened nor be melted and the fine pattern will be faithfully transferred from the resist pattern to the substrate.

It will now be explained how a resist pattern is formed by using the resist according to the present invention.

First, the novolak, and the photosensitive agent and/or the sensitizer — all mentioned above, are dissolved in the solvent specified above thereby preparing a resist solution. Then, the resist solution is coated on a substrate by means of, e.g., spin coating or dipping. The resist solution coated on the substrate is dried at 150° C. or less, preferably 70 to 120° C., thus forming a resist layer on the substrate. The substrate used is, for example, a silicon single-crystal wafer, a silicon wafer with insulating films, conductive layers or the like deposited on it, or a mask blank.

Next, the resist layer formed on the substrate is exposed. Examples of the light source for exposure are conventional ultraviolet rays, ultraviolet rays of short wavelengths, electron beams, or X rays. The resist layer, thus exposed, is treated with an aqueous alkaline solution, thus forming a resist pattern desired. The exposed resist layer, if made of resist containing aminoplast resin, is baked at 110° C. for about 1 to 5 minutes, and then treated with an aqueous alkaline solution, thereby forming a resist pattern desired. The aqueous alkaline solution is, for example, an aqueous solution of tetramethylammonium hydroxide or an aqueous solution of chlorine.

Examples of the resist according to the present invention will now be described in detail. First, it will be explained how various novolak used in the invention are synthesized.

SYNTHESIS 1

First, 0.3 mol of m-cresol, 0.5 mol of p-cresol, and 0.2 mol of m-chlorophenol were added to 0.6 mol of formaldehyde, 1 g of oxalic acid, and 14 g of water. Then, these components were stirred, thus making a mixture. The mixture was heated and left to stand for 6 hours, allowing the reaction to occur. Thereafter, the reaction product was heated in vacuum, thereby distilling off the water and the unreacted residuals. Thus, novolak (CL-1) was synthesized.

SYNTHESIS 2

First, 0.3 mol of 3,5-xylenol, 0.35 mol of m-chlorophenol, and 0.35 mol of p-cresol were added to 0.6 mol of formaldehyde, 1 g of oxalic acid and 14 g of water. Then, these components were stirred, thus making a mixture. The mixture was heated and left to stand for 10 hours, allowing the reaction to occur. Thereafter, the reaction product was heated in vacuum, thereby distilling off the water and the unreacted residuals. Thus, novolak (CL-2) was synthesized.

SYNTHESIS 3

First, 0.5 mol of p-tert-butylphenol, 0.3 mol of p-cresol, and 0.2 mol of p-chlorophenol were added to 0.6 mol of formaldehyde, 1 g of oxalic acid, and 14 g of water. Then, these components were stirred, thus making a mixture. The mixture was heated and left to stand for 10 hours, allowing the reaction to occur. Thereafter, the reaction product was heated in vacuum, thereby distilling off the water and the unreacted residuals. Thus, novolak (CL-3) was synthesized.

SYNTHESIS 4

First, 0.3 mol of m-cresol, 0.5 mol of p-cresol, and 0.2 mol of m-bromphenol were added to 0.6 mol of formaldehyde, 1 g of oxalic acid, and 14 g of water. Then, these components were stirred, thus making a mixture. The mixture was heated and left to stand for 6 hours, allowing the reaction to occur. Thereafter, the reaction product was heated in vacuum, thereby distilling off the water and the unreacted residuals. Thus, novolak (BR-1) was synthesized.

SYNTHESIS 5

First, 0.3 mol of m-cresol, 0.5 mol of p-cresol, and 0.2 mol of m-fluorophenol were added to 0.6 mol of formaldehyde, 1 g of oxalic acid, and 14 g of water. Then, these components were stirred, thus making a mixture. The mixture was heated and left to stand for 6 hours, allowing the reaction to occur. Thereafter, the reaction product was heated in vacuum, thereby distilling off the water and the unreacted residuals. Thus, novolak (FR-1) was synthesized.

SYNTHESIS 6

First, 0.3 mol of 3,5-xyleno, 0.31 mol of m-fluorophenol, and 0.39 mol of p-fluorophenol were added to 0.6 mol of formaldehyde, 1 g of oxalic acid, and 14 g of water. Then, these components were stirred, thus making a mixture. The mixture was heated and left to stand for 10 hours, allowing the reaction to occur. Thereafter, the reaction product was heated in vacuum, thereby distilling off the water and the unreacted residuals. Thus, novolak (FR-2) was synthesized.

SYNTHESIS 7

First, 0.5 mol of p-tert-butylphenol, 0.3 mol of p-cresol, and 0.2 mol of p-fluorophenol were added to 0.6 mol of formaldehyde, 1 g of oxalic acid, and 14 g of water. Then, these components were stirred, thus making a mixture. The mixture was heated and left to stand for 10 hours, allowing the reaction to occur. Thereafter, the reaction product was heated in vacuum, thereby distilling off the water and the unreacted residuals. Thus, novolak (FR-3) was synthesized.

PREPARATION OF RESIST SOLUTIONS

Solution A

Novolak RF-1 in the amount of 80 wt. % was mixed with 20 wt. % of 2,3,4,4'-tetrahydroxybenzophenone naphthoquinonediazide sulfonate ester, which was used as photosensitive agent, thereby forming a mixture. The mixture was dissolved in ethyl cellosolve acetate, thus preparing resist solution A.

Solution B

Novolak FR-2 in the amount of 80 wt. % was mixed with 20 wt. % of 2,3,4,4'-tetrahydroxybenzophenone naphthoquinonediazide sulfonate ester, thereby forming a mixture. The mixture was dissolved in ethyl cellosolve acetate, thus preparing resist solution B.

Solution C

Novolak FR-3 in the amount of 80 wt. % was mixed with 20 wt. % of 2,3,4,4'-tetrahydroxybenzophenone naphthoquinonediazide sulfonate ester, thereby forming a mixture. The mixture was dissolved in ethyl cellosolve acetate, thus preparing resist solution C.

Solution D

Novolak CL-2 (100 wt. %) was dissolved in ethyl cellosolve acetate, thereby preparing resist solution D.

Solution E

Novolak CL-2 in the amount of 95 wt. % was mixed with 5 wt. % of aminoplast resin (Cymel 325 manufactured by American Cynamide, Inc.), thereby forming a mixture. The mixture was dissolved in ethyl cellosolve acetate, thereby preparing resist solution E.

Solution F

Novolak CL-3 in the amount of 95 wt. % was mixed with 5 wt. % of aminoplast resin (Cymel 325), thereby forming a mixture. The mixture was dissolved in ethyl cellosolve acetate, thereby preparing resist solution F.

Solution G

Novolak BR-1 in the amount of 95 wt. % was mixed with 5 wt. % of aminoplast resin (Cymel 325), thereby forming a mixture. The mixture was dissolved in ethyl cellosolve acetate, thereby preparing resist solution G.

Solution H

Novolak CL-1 in the amount of 90 wt. % was mixed with 10 wt. % of 4,4'-diazidediphenylsulfone, thereby forming a mixture. The mixture was dissolved in ethyl cellosolve acetate, thereby preparing resist solution H.

In these solutions, ethyl cellosolve acetate was used in the amount of 250 parts by weight with respect to 100 parts by weight of the total solid component of the resist.

EXAMPLES 1-12

The resist solution B were spin-coated on two silicon wafers, thus forming two 1.5 μm-resist layers on the wafers. The resist solution C were spin-coated on two silicon wafers, thereby forming two 1.5 μm-resist layers. The resist solution E were spin-coated on two silicon wafers, thus forming two 1.5 μm-resist layers. The resist solution F were spin-coated on two silicon wavers, thus forming two 1.5 μm-resist layers. The remaining four resist solutions were coated on four silicon wafers, respectively, thus forming four 1.5 μm-resist layers on the silicon wafers. The 12 resist layers were exposed to light under the conditions specified in Table 4. Then, the resist layers were immersed in 2.38% aqueous solution of tetramethyl-ammonium hydroxide for 50 seconds, whereby 12 resist patterns were obtained.

The photosensitivities of the resist patterns, i.e., Examples 1 to 12 of the invention, were evaluated in terms of optimum exposure dose, and the resolution, which these patterns exhibited when exposed to the optimum dose, was measured. The resist patterns were then put on a hot plate, and were heated until they warped. The heat resistances of the patterns were evaluated in terms of the temperatures at which the patterns started warping. The results are shown in Table 4.

As is evident from Table 4, Examples 1 to 12 are resists having high photosensitivity, high resolution, and high heat resistance.

As has been described, the present invention provides resist which has not only high sensitivity to ultraviolet rays and ionizing radiation and high resolution, but also high heat resistance. Hence, a resist pattern made of the resist and formed on a substrate or the like hardly softens or melts when the substrate i heated during dry etching process. The fine pattern of the resist can, therefore, be transferred faithfully to the substrate. The resist according to the invention is useful in photo-etching process performed to manufacture semiconductor devices having high integration densities.

TABLE 1

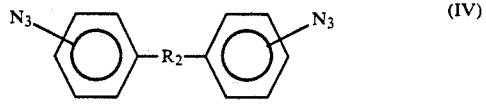

Note: $R_2$ is $-CH_2-$, $-O-$, $-CH=CH-$, $-N=N-$, $-S-$, $-SO_2-$,

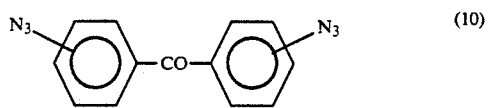

TABLE 1-continued

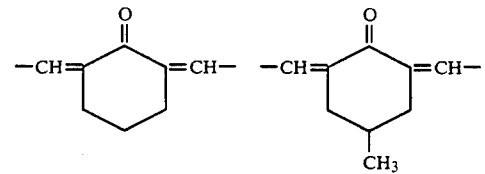

TABLE 2

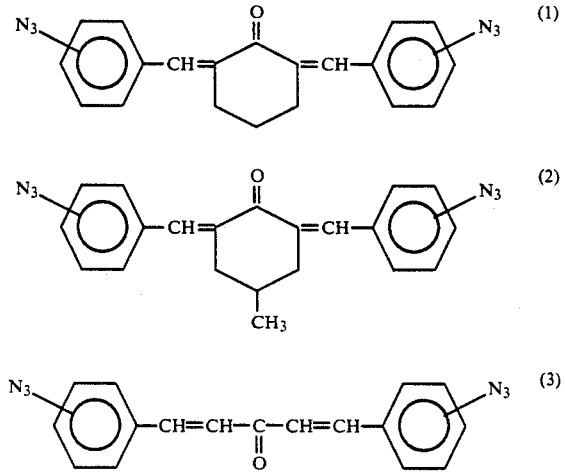

TABLE 2-continued

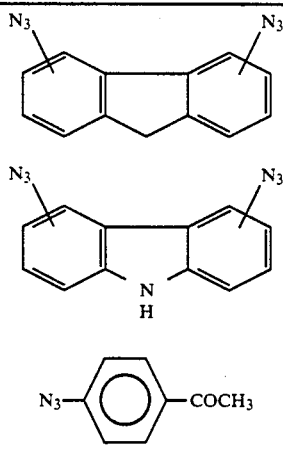

TABLE 2-continued

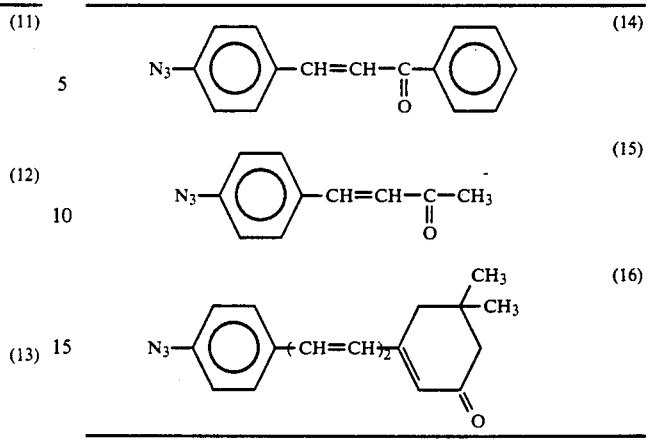

TABLE 3

| Resist | Novolak Symbol | Amount (wt %) | Photosensitive Agent Name | Amount (wt %) | Additives |
|---|---|---|---|---|---|
| A | FR-1 | 80 | 2,3,4,4'-tetrahydroxybenzophenone naphthoquinonediazidesulfonate ester | 20 | — |
| B | FR-2 | 80 | 2,3,4,4'-tetrahydroxybenzophenone naphthoquinonediazidesulfonate ester | 20 | — |
| C | FR-3 | 80 | 2,3,4,4'-tetrahydroxybenzophenone naphthoquinonediazidesulfonate ester | 20 | — |
| D | CL-2 | 100 | — | — | — |
| E | CL-2 | 95 | — | — | Aminoplast resin [Cymel 325, American Cynamide, Inc.] (5 wt %) |
| F | CL-3 | 95 | — | — | Aminoplast resin [Cymel 325, American Cynamide, Inc.] (5 wt %) |
| G | BR-1 | 95 | — | — | Aminoplast resin [Cymel 325, American Cynamide, Inc.] (5 wt %) |
| H | CL-1 | 90 | 4,4'-diazidediphenylsulfone | 10 | — |

TABLE 4

| | Resist | Exposure Condition | Sensitivity | Resolution | Heat Resistance | Remarks |
|---|---|---|---|---|---|---|
| Example 1 | A | g-line stepper *1 (N.A. 0.45) | 70 mJ | 0.5 μm | 110° C. | Positive Type |
| Example 2 | B | g-line stepper *1 (N.A. 0.45) | 75 mJ | 0.5 μm | 130° C. | Positive Type |
| Example 3 | B | Electron-beam exposure (Acceleration voltage: 20 KeV) | 20 μC/cm$^2$ | 0.3 μm | 130° C. | Positive Type |
| Example 4 | C | g-line stepper *1 (N.A. 0.45) | 68 mJ | 0.5 μm | 135° C. | Positive Type |
| Example 5 | C | Electron-beam exposure (Acceleration voltage: 20 KeV) | 19 μC/cm$^2$ | 0.3 μm | 135° C. | Positive Type |
| Example 6 | D | Electron-beam exposure (Acceleration voltage: 20 KeV) | 120 μC/cm$^2$ | 0.3 μm | >130° C. | Negative Type |
| Example 7 | E | Electron-beam exposure (Acceleration voltage: 20 KeV) | 1.2 μC/cm$^2$ | 0.3 μm | >130° C. | Negative-type PEB *2 at 110° C. for 3 min. |
| Example 8 | F | Electron-beam exposure (Acceleration voltage: 20 KeV) | 2.4 μC/cm$^2$ | 0.3 μm | >130° C. | Negative type PEB *2 at 110° C. for 3 min. |
| Example 9 | G | Electron-beam exposure (Acceleration voltage: 20 KeV) | 5.4 μC/cm$^2$ | 0.3 μm | >130° C. | Negative-type PEB *2 at 110° C. for 3 min. |
| Example 10 | H | Electron-beam exposure (Acceleration voltage: 20 KeV) | 10.2 μC/cm$^2$ | 0.4 μm | >130° C. | Negative-type PEB *2 at 110° C. for 3 min. |
| Example 11 | E | Excimer laser stepper (N.A. 0.35) | 48 mJ | 0.4 μm | >130° C. | Negative-type PEB *2 at 110° C. |

TABLE 4-continued

| | Resist | Exposure Condition | Sensitivity | Resolution | Heat Resistance | Remarks |
|---|---|---|---|---|---|---|
| Example 12 | F | Excimer laser stepper (N.A. 0.35) | 60 mJ | 0.4 μm | >130° C. | for 3 min. Negative-type PEB *2 at 110° C. for 3 min. |

*1 Step-and-repeat exposure apparatus
*2 PEB: Post Exposure Baking

What is claimed is:

1. A positive-type ionization irradiation sensitive and/or deep UV sensitive resist containing a quinone diazide photosensitive agent and a novolak prepared by condensing a halogenated phenol represented by the following formula (I) and one or more phenol derivatives selected from the group consisting of cresol, xylenol, tert-butylphenol and propenylphenol, with a carbonyl compound,

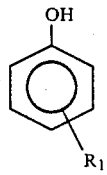
(I)

wherein $R_1$ is F.

2. A negative-type ionization irradiation sensitive and/or deep UV sensitive resist, containing a novolak and an aminoplast resins, wherein said novolak is prepared by condensing a halogenated phenol represented by the following formula (II) and one or more phenol derivatives selected from the group consisting of cresol, xylenol, tert-butylphenol and propenylphenol, with a carbonyl compound,

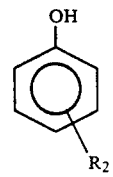
(II)

wherein $R_2$ is Cl.

* * * * *